(12) United States Patent
Foster et al.

(10) Patent No.: US 6,764,912 B1
(45) Date of Patent: Jul. 20, 2004

(54) PASSIVATION OF NITRIDE SPACER

(75) Inventors: John Clayton Foster, Mountain View, CA (US); Eric N. Paton, Morgan Hill, CA (US); Matthew S. Buynoski, Palo Alto, CA (US); Qi Xiang, San Jose, CA (US); Paul R. Besser, Sunnyvale, CA (US); Paul L. King, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 32 days.

(21) Appl. No.: 09/919,943

(22) Filed: Aug. 2, 2001

(51) Int. Cl.[7] .................................... H01L 21/336
(52) U.S. Cl. ................. 438/305; 438/229; 438/307; 438/656
(58) Field of Search ................. 438/229, 294, 438/296, 299, 301, 303, 304, 305, 306, 307, 655, 656, 657, 663, 664

(56) References Cited

U.S. PATENT DOCUMENTS

| | | | |
|---|---|---|---|
| 5,153,145 A | 10/1992 | Lee et al. ................ 437/44 |
| 5,744,395 A | 4/1998 | Shue et al. .............. 438/305 |
| 5,747,373 A | 5/1998 | Yu ........................ 438/305 |
| 5,843,820 A | 12/1998 | Lu ........................ 438/243 |
| 5,851,890 A | 12/1998 | Tsai et al. .............. 438/303 |
| 5,866,473 A | 2/1999 | Xiang et al. ............ 438/585 |
| 5,904,517 A | 5/1999 | Gardner et al. ......... 438/197 |
| 5,960,270 A | 9/1999 | Misra et al. ............ 438/197 |
| 5,972,804 A | 10/1999 | Tobin et al. ............ 438/786 |
| 5,973,372 A | 10/1999 | Omid-Zohoor et al. ... 257/383 |
| 6,001,738 A | 12/1999 | Lin et al. ............... 438/683 |
| 6,004,878 A | 12/1999 | Thomas et al. ......... 438/655 |
| 6,008,095 A | 12/1999 | Gardner et al. ......... 438/296 |
| 6,017,823 A | 1/2000 | Shishiguchi et al. .... 438/696 |
| 6,025,267 A * | 2/2000 | Pey et al. ............... 438/656 |
| 6,027,961 A | 2/2000 | Maiti et al. ............. 438/199 |
| 6,051,470 A | 4/2000 | An et al. ................ 438/283 |
| 6,063,698 A | 5/2000 | Tseng et al. ............ 438/585 |
| 6,107,667 A | 8/2000 | An et al. ................ 257/408 |
| 6,162,667 A * | 12/2000 | Funai et al. ............ 438/166 |
| 6,483,154 B1 * | 11/2002 | Ngo et al. .............. 257/384 |
| 6,500,720 B2 * | 12/2002 | Kunikiyo ............... 438/305 |
| 6,507,123 B1 * | 1/2003 | Woo et al. .............. 257/384 |
| 6,555,483 B2 * | 4/2003 | Hasegawa .............. 438/765 |
| 6,586,345 B1 * | 7/2003 | Ohmori .................. 438/770 |
| 2003/0038327 A1 * | 2/2003 | Smith .................... 257/415 |
| 2003/0087195 A1 * | 5/2003 | Kim et al. .............. 430/313 |

OTHER PUBLICATIONS

U.S. patent application Publication US 2002/0146904 A1; Buynoski et al.*
U.S. patent application Publication US 2002/0111021 A1; Paton et al.*

* cited by examiner

Primary Examiner—George Fourson
Assistant Examiner—Fernando L. Toledo
(74) Attorney, Agent, or Firm—McDermott, Will & Emery

(57) ABSTRACT

The formation of metal silicides in silicon nitride spacers on a gate electrode causes bridging between a gate electrode and the source and drain regions of a semiconductor device. The bridging is prevented by forming a thin layer of silicon oxide on the silicon nitride spacers prior to forming the metal silicide layers on the device.

11 Claims, 4 Drawing Sheets

PASSIVATION OF NITRIDE SPACER

FIELD OF INVENTION

The invention pertains to passivating a silicon nitride spacer to prevent silicide bridging between the gate electrode and the source and drain regions.

BACKGROUND OF THE INVENTION

FIG. 1 shows a typical prior art MOSFET device 10 comprising a semiconductor substrate 11, field oxide (FOX) regions 12, source and drain regions 13 and 14, and a gate electrode. The substrate 11 consists of a P-doped single crystalline silicon to form a P type substrate. The thick field oxide (FOX) regions 12 are formed on either side of the source and drain regions 13 and 14 for isolation purposes. The gate electrode is formed on the surface of semiconductor substrate between the source and drain regions. The gate electrode typically includes a thin silicon oxide layer 16 and a polysilicon layer 17. Silicon dioxide spacers 18 formed on the sidewalls of the gate electrode. Refractory metal silicide contacts 19 and 20 are formed typically on the surface of drain and source regions 13 and 14 on the horizontal surface of substrate 11 and on the horizontal top surface 21 of the gate electrode by a process known as a self-aligned silicide or salicide process. The silicides result from the thermal reaction of the metal and silicon in regions 13 and 14 and polysilicon layer 17.

While the sidewall spacers are intended to prevent bridging of the gate silicide region with either the source or drain silicide regions, as device geometries become smaller, bridging between the silicide formed on the top surface 21 and the metal silicide contacts 19 and 20 has again become a serious problem. It is known that native oxide or oxide residues from the anisotropic etching to form the silicon oxide spacers will form on the exposed top surface of the polysilicon gate as well as on the top surfaces of the source and drain regions. These oxides must be removed to allow the subsequent metal silicide formation to be successful because the oxides will prevent the reaction between the metal and the exposed silicon surfaces during the annealing step. In order to remove the oxides, the surfaces are typically treated with 1 vol. % HF solution prior to deposition of the metal. However, while hydrofluoric acid etches the native oxide, it also etches the silicon oxide spacers 18 causing significant thinning and exposing the surface of the polysilicon 17 in the gate structure resulting in a metal silicide being formed during the silicide process to cause bridging to occur on the sides of the polysilicon gate.

A solution to the problem is disclosed in U.S. Pat. Nos. 5,747,373 and 5,851,890 wherein a double insulator spacer is used to prevent the metal silicide bridging phenomena. Specifically, the spacer comprises two layers, a first layer comprising silicon oxide that is formed on the sides of the polysilicon gate and a second layer comprising silicon nitride which is formed on the first layer. The double layer prevents the oxide layer from being etched because it is not affected by the HF etchant.

However, the silicon nitride includes dangling silicon bonds that can react with the metal during the salicide process. Most notably this occurs with nickel. These bonds form a thin nickel silicide layer over the spacer. This thin layer leads to bridging between the gate electrode and the source and drain regions of the transistor which can result in an increase in transistor resistance.

It has been discovered that by coating the nitride layer with a thin layer of silicon oxide prior to the etching and the salicide process, the bridging problem is significantly reduced, if not eliminated.

SUMMARY OF THE INVENTION

The object of this invention is to provide passivate silicon nitride spacers by coating the spacers with a thin coating of silicon oxide to avoid silicidation bridging. To accomplish the object described above according to the present invention, there is provided a method for passivating a silicon nitride spacer which comprises the steps of covering the entire surface of a semiconductor substrate including source and drain regions, a gate electrode with a thin layer of silicon oxide, etching the top surface of the gate electrode and the top surfaces of the source and drain regions just prior to depositing the metal in the silicidation process. The other objects and characteristics of the present invention will become apparent from the further disclosure of the invention which is given hereinafter with reference to the accompanying drawing.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings.

DETAILED DESCRIPTION OF THE INVENTION

This invention relates to a method and a semiconductor device prepared therefrom for passivation of a silicon nitride layer to prevent bridging between the gate and electrode and the source and drain regions of the transistor in a semiconductor device.

Figure 1:
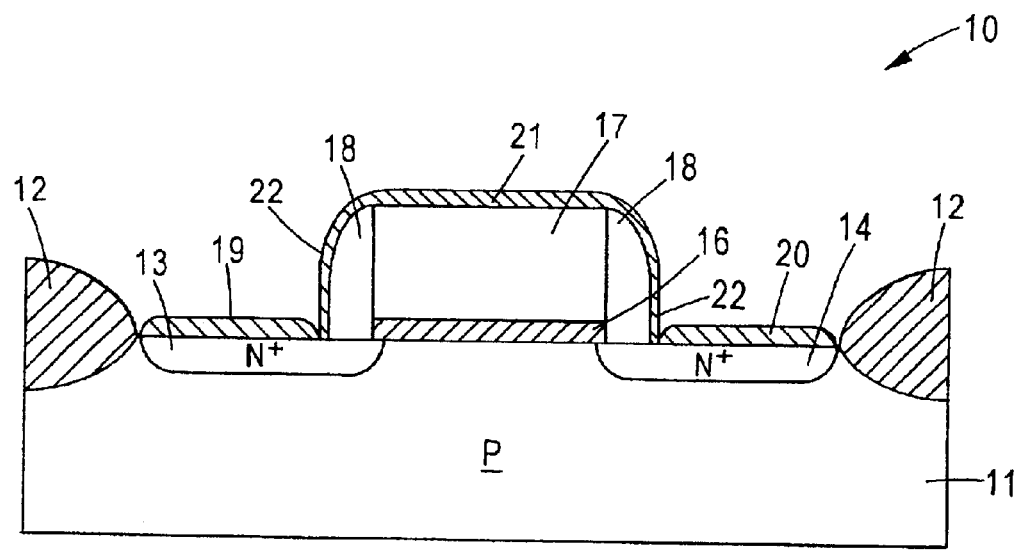
FIG. 1 is a sectional side view showing a prior art structure illustrating an integrated circuit structure on a silicon substrate with silicon dioxide spacers on the sidewalls of a polysilicon gate electrode.
Figure 2A:
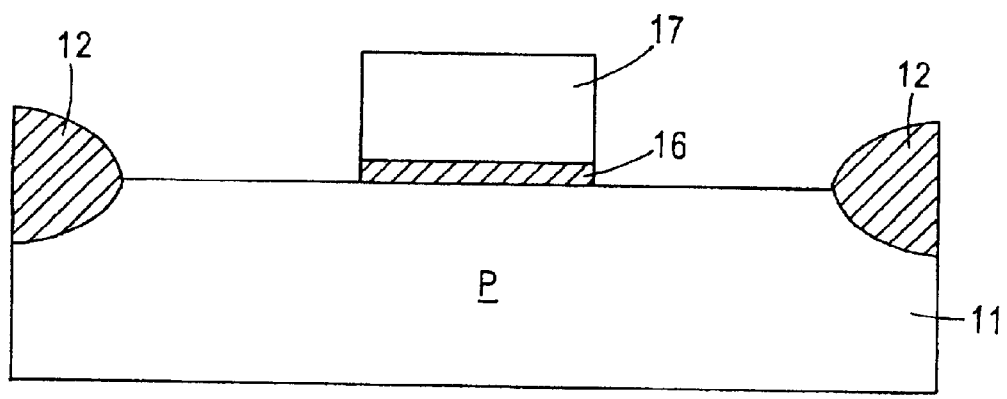
FIGS. 2A–2G schematically illustrate, in cross-sectional style, the key stages for fabricating a MOSFET device with silicon nitride spacers featuring a thin silicon oxide layer on the spacers to passivate the nitride during the salicide process.

FIG. 2A is a cross-sectional view of the first stage of the process. A semiconductor substrate 11 is shown having isolation regions 12. The semiconductor substrate can be silicon or a silicon on insulator (SOI) structure. The substrate 11 can be an N-type or P-type silicon. For illustrative purposes only, FIG. 2A shows semiconductor substrate as a single crystalline silicon that is doped with a P-type dopant.

The isolation regions 12 may be shallow trench isolation (STI) regions or field oxide (FOX) regions that can be formed using any known localized oxidation of silicon (LOCOS) isolation methods. For example, thick field oxide (FOX) regions 12 can be formed by thermal oxidation in an oxygen-steam ambient at a temperature between 850° to 1050° C. The thickness of the regions is from about 4000 to about 6000 Å. Oxidation is prevented in the region between the FOX regions by using a patterned, oxidation resistant mask that is removed after the oxidation process is completed.

The gate electrode comprises a dielectric layer 16 and a gate conductor layer 17. The gate dielectric layer 16 is formed on upper surface of substrate 11 between isolation regions 12. The gate dielectric layer 16 is typically silicon oxide, but it can also be silicon oxynitride or a high-K dielectric such as tantalum pentoxide ($Ta_2O_5$). The layer can also be a composite layer of silicon oxide and silicon nitride. The thickness of the gate dielectric layer 16 is from about 20 to about 100 Å. The gate dielectric layer 16 can be formed by using conventional chemical vapor deposition (CVD) techniques.

The gate conductor layer 17 is formed over the gate dielectric layer 16. The gate conductor layer 17 is a polysilicon material and is about 400 to about 1000 Å thick. The polysilicon material is typically a mixture of polysilicon and amorphous silicion. Once formed, the gate dielectric layer 16 and the gate conductor layer 17 are patterned to form a gate structure by using well known photolithographic and etching techniques. The thickness of the total gate electrode is between 420 Å and 1100 Å. The gate electrode is formed by providing a layer of silicon dioxide as the gate insulator layer by thermally growing the oxide in an oxygen-steam ambient at a temperature between 850° to 1050° C. to a thickness between about 50 and about 200 Å. Next, a polysilicon layer is deposited on the gate insulator by any conventional process such as a low pressure chemical vapor deposition process at a temperature between 600° to 800° C. The thickness of the gate insulator is from about 500 Å to about 5000 Å. The polysilicon layer can be doped using conventional techniques and conventional photolithographic and reactive etching procedures to create the polycrystalline gate structure. The width of the polycrystalline gate structure is between about 50 nm and about 1 µm.

Figure 2B:
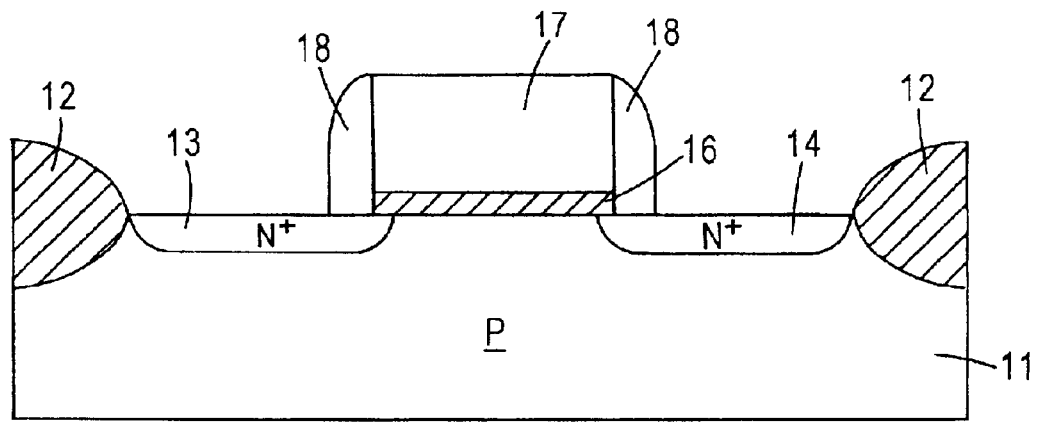

FIG. 2B shows forming the source and drains regions 13 and 14 adjacent to the opposite sides of the gate electrode. The formation of the source and drain regions 13 and 14 can be accomplished by any known methods such as by the conventional ion implantation of phosphous or arsenic. Nothwithstanding the methods, for illustrative purposes only, FIG. 2B shows the semiconductor substrate 11 as a P-type silicon and and the source and drain regions as doped N-type. Alternatively, but not shown, the semiconductor substrate 11 could be an N-type and the source and drain regions 13 and 14 could be P-type.

Silicon nitride sidewall spacers 18 are used during the formation of the source and drain regions 13 and 14. The spacers 18 are formed by depositing a blanket layer of silicon nitride (not shown) and anisotropically etching the nitride layer to form spacers 18. The anisotropic etch method is selected because it will remove the nitride from the upper surface of the gate electrode and the surface of the semiconductor substrate, but not the nitride on the side walls of the gate electrode. The average typical thickness for each spacer is from about 50 to about 500 Å.

Figure 2C:
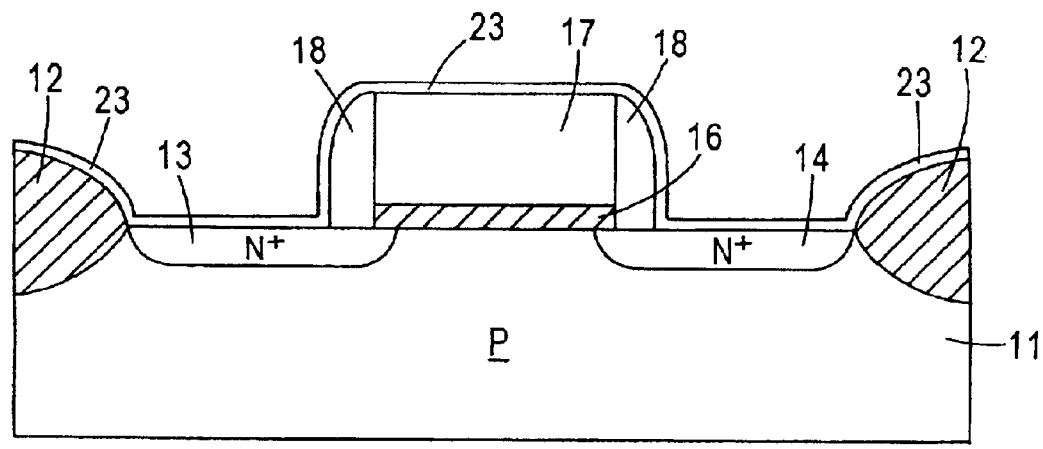
Figure 2D:
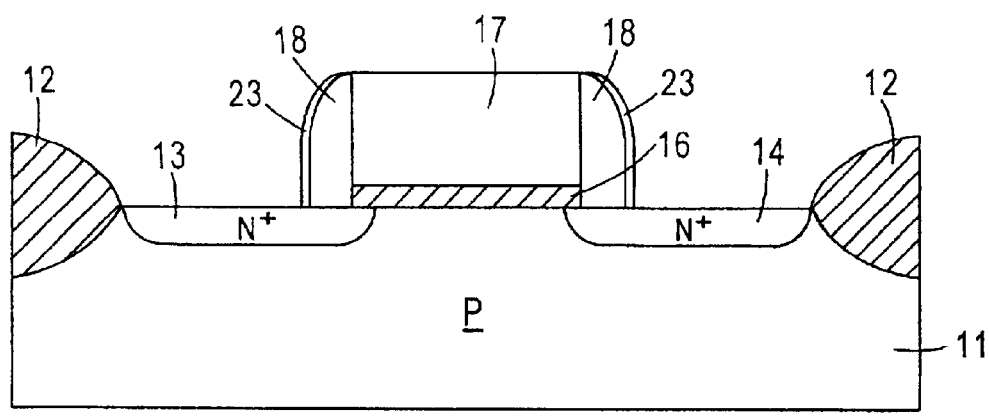
Figure 2E:
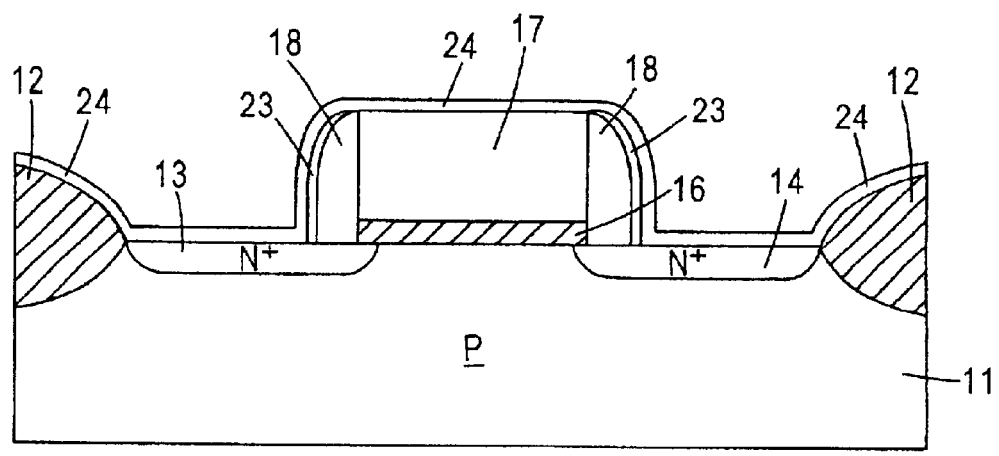

In FIG. 2C, a thin silicon oxide layer 23 is formed on the semiconductor substrate including the gate electrode, the spacers 18, the source and drain regions 13 and 14 and the isolation regions 12. The thickness of the layer 23 is from about 20 Å to about 100 Å. The silicon oxide layer 23 is formed by treating the substrate 11 in a mixture of sulfuric acid and hydrogen peroxide at a temperature of about 300° C. The thin silicon oxide layer 23 is removed from the surface of the source and drain regions 13 and 14 and the top surface of the gate electrode to form the device shown in FIG. 2D FIG. 2E shows a blanket layer 24 of nickel deposited on the top surface of the semiconductor substrate 11 including the gate electrode, spacers 18, the source and drain regions 13 and 14 and the isolation regions 12. The nickel layer 24 is deposited by using a PVD process such as DC sputtering.

Figure 2F:
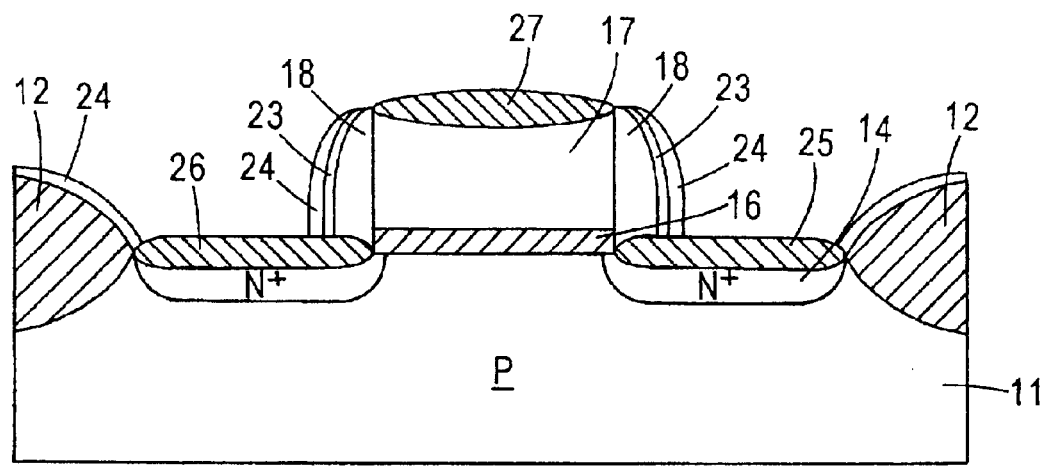

The thickness of the refractory metal deposited in this step depends upon several factors, including, inter alia, the particular selected metal, its Si consumption ratio, and desired thickness (hence resistivity) of the resultant refractory metal silicide. The conversion of Ni to NiSi may be accomplished by means of a one-step thermal process, typically RTA performed at temperatures of from about 350 to about 750° C., for example, in a nitrogen ($N_2$)-containing inert atmosphere at 550° C. for about 40 sec. The formation of NiSi commences at about 250° C., when the Ni layer reacts with silicon to form $Ni_2Si$. With increase in reaction time or temperature to above about 300° C., the $Ni_2Si$ undergoes further reaction with silicon in the source and drain regions and with the polysilicon material in the gate conductor to form NiSi layers 25, 26 and 27, respectively, as shown in FIG. 2F. Because of the thin silicon oxide 23 on the spacer 18, no nickel silicide is formed on the nitride spacer.

Figure 2G:
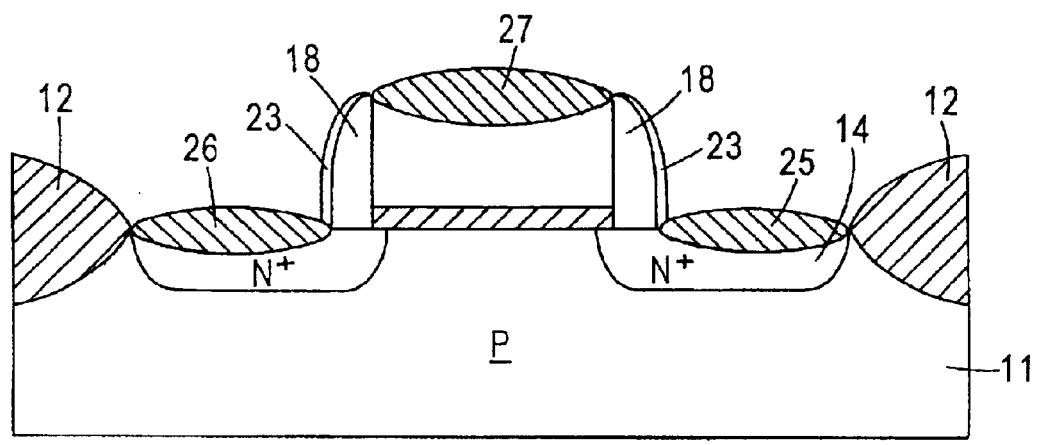

Unreacted nickel 24 must be removed from areas where silicide does not form to produce the device shown in FIG. 2G. This is accomplished by using an anisotropic sputter etching or by with a 2:1 $H_2SO_4/H_2O_2$ mixture at a temperature of about 100° C.

The foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalence thereof may be resorted to, falling within the scope of the invention claimed

What is claimed is:

1. A method of passivating a silicon nitride spacer comprising the steps of:
   providing a semiconductor substrate having a horizontal surface;
   forming source and drain regions in the surface of the substrate;
   forming a gate electrode on the horizontal surface of the substrate between said source and drain regions, said gate electrode having a horizontal top surface and sidewalls;
   providing silicon nitride spacers on the sidewalls of the gate electrode;
   depositing a layer of silicon oxide having a thickness of between 20 and 40 Å over silicon nitride spacers and said horizontal surface of said semiconductor substrate and the horizontal top surface of said gate electrode;
   removing the silicon oxide layer over said horizontal surface of said semiconductor substrate and the horizontal top surface of said gate electrode;
   depositing nickel on said horizontal top surface of said gate and the horizontal surface of the substrate; and
   annealing to react the nickel with silicon in the horizontal top surface of the gate electrode and in the horizontal surface of the substrate to form a metal silicide on said horizontal surfaces.

2. The method of claim 1, wherein said silicon oxide is formed by treating said substrate in a mixture of sulfuric acid and hydrogen peroxide.

3. The method of claim 1, wherein the gate dielectric is a dielectric selected from the group consisting of silicon dioxide, silicon oxynitride or a high-K dielectric.

4. The method of claim 1, where in the thickness of the silicon oxide layer is 20 Å.

5. The method of claim 1, wherein the silicon oxide is removed using anisotropic sputter etching.

6. The method of claim 1, further including the step of removing the unreacted nickel.

7. A method of passivating a silicon nitride spacer comprising the steps of:
   providing a semiconductor substrate having a horizontal surface;
   forming source and drain regions in the surface of the substrate;
   forming a gate electrode on the horizontal surface of the substrate between said source and drain regions, said gate electrode having a horizontal top surface and sidewalls;
   providing silicon nitride spacers on the sidewalls of the gate electrode;
   depositing a layer of silicon oxide having a thickness of between 20 and 40 Å over silicon nitride spacers and said horizontal surface of said semiconductor substrate and the horizontal top surface of said gate electrode;
   removing the silicon oxide layer over said horizontal surface of said semiconductor substrate and the horizontal top surface of said gate electrode;
   depositing nickel on said horizontal top surface of said gate and the horizontal surface of the substrate;
   annealing to react the nickel with silicon in the horizontal top surface of the gate electrode and in the horizontal surface of the substrate to form a metal silicide on said horizontal surfaces; and
   wherein said silicon oxide is formed by treating said substrate in a mixture of sulfuric acid and hydrogen peroxide.

8. The method of claim 7, wherein the gate dielectric is a dielectric selected from the group consisting of silicon dioxide, silicon oxynitride or a high-K dielectric.

9. The method of claim 7, wherein the thickness of the silicon oxide layer is 20 Å.

10. The method of claim 7, wherein the silicon oxide is removed using anisotropic sputter etching.

11. The method of claim 7, further including the step of removing the unreacted nickel.

* * * * *